(12) United States Patent
Kwon et al.

(10) Patent No.: US 12,545,019 B2
(45) Date of Patent: Feb. 10, 2026

(54) PROTECTIVE FILM AND METHOD OF REMOVING PROTECTIVE FILM

(71) Applicant: Samsung Display Co., Ltd., Yongin-si (KR)

(72) Inventors: Ohjune Kwon, Yongin-si (KR); Heechang Yoon, Yongin-si (KR); Sangyeon Hwang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 108 days.

(21) Appl. No.: 18/364,350

(22) Filed: Aug. 2, 2023

(65) Prior Publication Data

US 2024/0123724 A1 Apr. 18, 2024

(30) Foreign Application Priority Data

Oct. 17, 2022 (KR) .................. 10-2022-0133539

(51) Int. Cl.
*B32B 43/00* (2006.01)

(52) U.S. Cl.
CPC ........ *B32B 43/006* (2013.01); *B32B 2457/20* (2013.01)

(58) Field of Classification Search
CPC .. B32B 43/006; B32B 2457/20; H10K 50/84; H10K 71/00; Y10T 156/1911
See application file for complete search history.

(56) References Cited

U.S. PATENT DOCUMENTS

| | | | |
|---|---|---|---|
| 5,604,038 A * | 2/1997 | Denes ................. | B05D 3/147 428/688 |
| 9,136,502 B2 | 9/2015 | Kwack et al. | |
| 2013/0048224 A1 * | 2/2013 | George ............... | B32B 38/1858 156/752 |
| 2017/0133243 A1 * | 5/2017 | Thallner ........... | H01L 21/68714 |
| 2019/0375195 A1 * | 12/2019 | Choi ................... | H04M 1/0266 |
| 2021/0323293 A1 * | 10/2021 | Kim ..................... | B32B 37/1036 |
| 2022/0010071 A1 * | 1/2022 | Kim ..................... | C07D 493/10 |
| 2022/0320466 A1 * | 10/2022 | Chen .................. | H10K 59/8731 |

FOREIGN PATENT DOCUMENTS

| | | |
|---|---|---|
| CN | 205255700 U | 5/2016 |
| JP | 2000-164682 A | 6/2000 |
| KR | 10-1015851 B1 | 2/2011 |
| KR | 10-2021-0018688 A | 2/2021 |

OTHER PUBLICATIONS

Martin Y.M. Chiang et al., Combinatorial approach to the edge delamination test for thin film reliability—concept and simulation, Thin Solid Films vol. 437, Issues 1-2, Aug. 1, 2003, pp. 197-203.

* cited by examiner

*Primary Examiner* — Alex B Efta
*Assistant Examiner* — Alexander S Wright
(74) *Attorney, Agent, or Firm* — Womble Bond Dickinson (US) LLP (57) ABSTRACT

Provided is a protective film including a first protective film configured to cover an upper surface of a display panel, the first protective film including a flat portion, inclined portions extending from the flat portion, and surrounding the flat portion in plan view, and boundary portions respectively between the inclined portions, and respectively corresponding to corners of the flat portion, wherein the inclined portions and the boundary portions become thinner in a direction away from the flat portion.

13 Claims, 10 Drawing Sheets

PROTECTIVE FILM AND METHOD OF REMOVING PROTECTIVE FILM

CROSS-REFERENCE TO RELATED APPLICATION

This application claims priority to, and the benefit of, Korean Patent Application No. 10-2022-0133539, filed on Oct. 17, 2022, in the Korean Intellectual Property Office, the entire contents of which are hereby incorporated by reference.

BACKGROUND

1. Field

The present disclosure herein relates to a protective film, and to a method of removing a protective film.

2. Description of the Related Art

Electronic apparatus, such as smart phones, digital cameras, laptop computers, navigation units, and smart televisions, which provide an image to a user, include a display device for displaying the image. Such a display device generates an image, and provides the image to a user via a display screen.

The display device includes a substrate and a plurality of pixels located on the substrate. Because the substrate may be vulnerable to external shocks and scratches that may occur during transfer, a panel protective film is located on the upper or lower portion of a display panel to protect the substrate.

After the display panel including the substrate and the pixels is transferred to a chamber for a subsequent process, the panel protective film is removed. When the panel protective film is removed, a method of removing the panel protective film that may reduce or minimize damage to the display panel is required.

SUMMARY

The present disclosure reduces or prevents the likelihood of a display panel being damaged when a panel protective film is separated.

One or more embodiments provide a protective film including a first protective film configured to cover an upper surface of a display panel, the first protective film including a flat portion, inclined portions extending from the flat portion, and surrounding the flat portion in plan view, and boundary portions respectively between the inclined portions, and respectively corresponding to corners of the flat portion, wherein the inclined portions and the boundary portions become thinner in a direction away from the flat portion.

The first protective film may have a higher coefficient of thermal expansion than the display panel.

The first protective film may have a coefficient of thermal expansion of about 45 ppm/K to about 55 ppm/K.

The protective film may further include a second protective film configured to cover a lower surface of the display panel, and having a shape symmetrical to that of the first protective film.

Heights of upper surfaces of the inclined portions and the boundary portions may decrease in a direction away from an upper surface of the flat portion, wherein lower surfaces of the inclined portions and the boundary portions are coplanar with a lower surface of the flat portion.

The first protective film may be configured to contract more than the display panel when a coolant is provided on the first protective film.

When the first protective film is contracted, edges of the inclined portions and the boundary portions may be separated from the display panel.

One or more embodiments provide a method of removing a protective film, the method including applying a resin onto a display panel, forming a first protective film by curing the resin, providing a coolant to a surface of the first protective film, separating an edge of the first protective film from the display panel, and removing the first protective film from the display panel, wherein the first protective film includes a flat portion, inclined portions extending from the flat portion, and surrounding the flat portion in plan view, and boundary portions respectively between the inclined portions, and respectively corresponding to corners of the flat portion, wherein the inclined portions and the boundary portions become thinner in a direction away from the flat portion.

The separating of the edge of the first protective film from the display panel may include contracting upper surfaces of the boundary portions.

The removing of the first protective film from the display panel may include separating the first protective film from edges of the boundary portions.

The separating of the edge of the first protective film from the display panel may include contracting upper surfaces of the inclined portions.

The first protective film may have a higher coefficient of thermal expansion than the display panel.

The first protective film may have a coefficient of thermal expansion of about 45 ppm/K to about 55 ppm/K.

The first protective film may be contracted more than the display panel when the coolant is provided onto the first protective film.

Heights of upper surfaces of the inclined portions and the boundary portions may decrease in a direction away from an upper surface of the flat portion, wherein lower surfaces of the inclined portions and the boundary portions are coplanar with a lower surface of the flat portion.

The coolant may include any one of a liquid nitrogen, a freon gas, or a carbon fluoride.

The method may further include providing the display panel on a stage, and fixing the display panel to the stage via vacuum suction holes defined in the stage.

The resin may include any one of an acrylate, an epoxy, or a silicone.

The method may further include applying the resin to a lower surface of the display panel, forming a second protective film by curing the resin, providing a coolant onto a surface of the second protective film, separating an edge of the second protective film from the display panel, and removing the second protective film from the display panel.

One or more embodiments provide a method of removing a protective film, the method including applying a resin onto a display panel, forming a first protective film by curing the resin, providing a coolant onto a surface of the first protective film, separating an edge of the first protective film from the display panel, and removing the first protective film from the display panel, wherein the first protective film includes a flat portion, inclined portions extending from the flat portion and surrounding the flat portion, and boundary portions between the inclined portions adjacent to each other to correspond to corners of the flat portion, wherein the inclined portions and the boundary portions become thinner in a direction away from the flat portion, and wherein the first protective film has a higher coefficient of thermal expansion than the display panel.

BRIEF DESCRIPTION OF THE DRAWINGS

The accompanying drawings are included to provide a further understanding of the present disclosure, and are incorporated in and constitute a part of this specification. The drawings illustrate embodiments of the present disclosure and, together with the description, serve to explain aspects of the present disclosure. In the drawings.

DETAILED DESCRIPTION

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may have various modifications and may be embodied in different forms, and should not be construed as being limited to only the illustrated embodiments herein. Further, each of the features of the various embodiments of the present disclosure may be combined or combined with each other, in part or in whole, and technically various interlocking and driving are possible. Each embodiment may be implemented independently of each other or may be implemented together in an association. The described embodiments are provided as examples so that this disclosure will be thorough and complete, and will fully convey the aspects of the present disclosure to those skilled in the art, and it should be understood that the present disclosure covers all the modifications, equivalents, and replacements within the idea and technical scope of the present disclosure. Accordingly, processes, elements, and techniques that are not necessary to those having ordinary skill in the art for a complete understanding of the aspects of the present disclosure may not be described.

Unless otherwise noted, like reference numerals, characters, or combinations thereof denote like elements throughout the attached drawings and the written description, and thus, descriptions thereof will not be repeated. Further, parts that are not related to, or that are irrelevant to, the description of the embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place.

Thus, the regions illustrated in the drawings are schematic in nature and their shapes are not intended to illustrate the actual shape of a region of a device and are not intended to be limiting. Additionally, as those skilled in the art would realize, the described embodiments may be modified in various ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form to avoid unnecessarily obscuring various embodiments.

Spatially relative terms, such as "beneath," "below," "lower," "lower side," "under," "above," "upper," "upper side," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below," "beneath," "or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, the phrase "in a plan view" means when an object portion is viewed from above, and the phrase "in a schematic cross-sectional view" means when a schematic cross-section taken by vertically cutting an object portion is viewed from the side. The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art. The expression "not overlap" may include meaning, such as "apart from" or "set aside from" or "offset from" and any other suitable equivalents as would be appreciated and understood by those of ordinary skill in the art. The terms "face" and "facing" may mean that a first object may directly or indirectly oppose a second object. In a case in which a third object intervenes between a first and second object, the first and second objects may be understood as being indirectly opposed to one another, although still facing each other.

It will be understood that when an element, layer, region, or component is referred to as being "formed on," "on," "connected to," or "(operatively or communicatively) coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. In addition, this may collectively mean a direct or indirect coupling or connection and an integral or non-integral coupling or connection. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled," or "directly on," refers to one component directly connecting or coupling another component, or being on another component, without an intermediate component. In addition, in the present specification, when a portion of a layer, a film, an area, a plate, or the like is formed on another portion, a forming direction is not limited to an upper direction but includes forming the portion on a side surface or in a lower direction. On the contrary, when a portion of a layer, a film, an area, a plate, or the like is formed "under" another portion, this includes not only a case where the portion is "directly beneath" another portion but also a case where there is further another portion between the portion and another portion. Meanwhile, other expressions describing relationships between components, such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions, such as "at least one of," or "any one of," when preceding a list of elements, modify the entire list of elements and do not modify the individual elements of the list. For example, "at least one of X, Y, and Z," "at least one of X, Y, or Z," "at least one selected from the group consisting of X, Y, and Z," and "at least one selected from the group consisting of X, Y, or Z" may be construed as X only, Y only, Z only, any combination of two or more of X, Y, and Z, such as, for instance, XYZ, XYY, YZ, and ZZ, or any variation thereof. Similarly, the expression, such as "at least one of A and B" and "at least one of A or B" may include A, B, or A and B. As used herein, "or" generally means "and/or," and the term "and/or" includes any and all combinations of one or more of the associated listed items. For example, the expression, such as "A and/or B" may include A, B, or A and B. Similarly, expressions, such as "at least one of," "a plurality of," "one of," and other prepositional phrases, when preceding a list of elements, modify the entire list of elements and do not modify the individual elements of the list.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure. The description of an element as a "first" element may not require or imply the presence of a second element or other elements. The terms "first," "second," etc. may also be used herein to differentiate different categories or sets of elements. For conciseness, the terms "first," "second," etc. may represent "first-category (or first-set)," "second-category (or second-set)," etc., respectively.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, while the plural forms are also intended to include the singular forms, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

When one or more embodiments may be implemented differently, a specific process order may be performed differently from the described order. For example, two consecutively described processes may be performed substantially at the same time or performed in an order opposite to the described order.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 1:
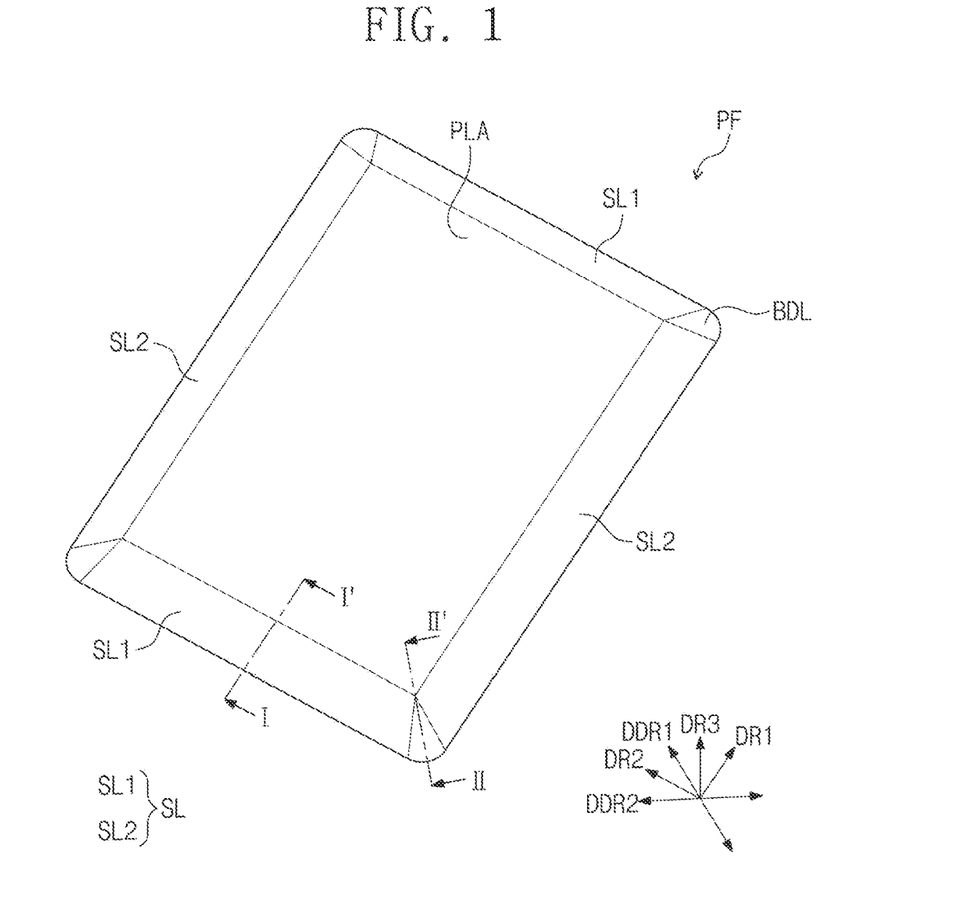
FIG. 1 is a perspective view of a panel protective film according to one or more embodiments of the present disclosure.
Figure 2:
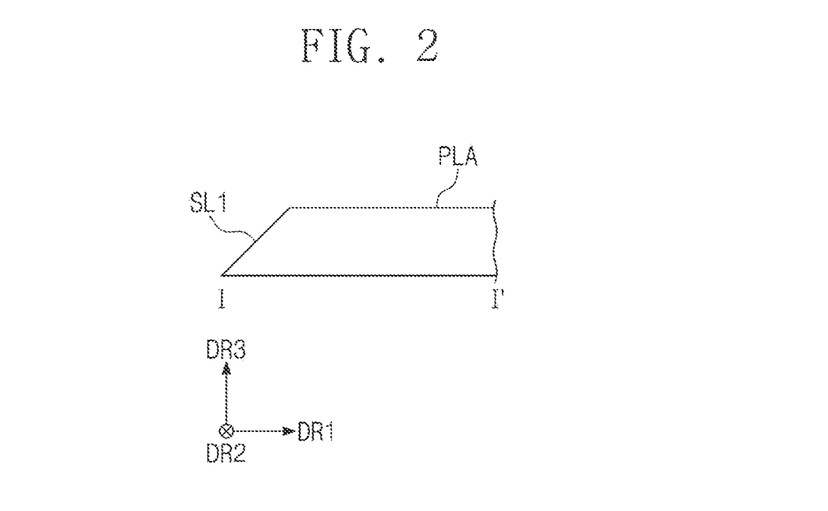
FIG. 2 is a cross-sectional view taken along the line I-I' of FIG. 1.
Figure 3:
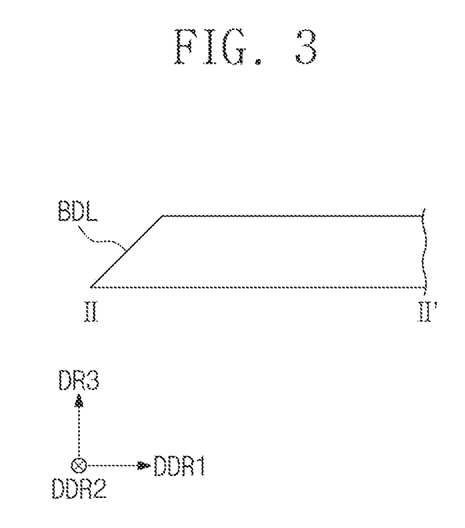
FIG. 3 is a cross-sectional view taken along the line II-II' of FIG. 1.

FIG. 1 is a perspective view of a panel protective film according to one or more embodiments of the present disclosure. FIG. 2 is a cross-sectional view taken along the line I-I' of FIG. 1. FIG. 3 is a cross-sectional view taken along the line II-II' of FIG. 1. FIG. 2 illustrates a cross-sectional view of one first inclined portion SL1 among a plurality of first inclined portions. FIG. 3 illustrates a cross-sectional view of one boundary portion BDL among a plurality of boundary portions BDL.

Referring to FIGS. 1 and 2, a protective film PF may include a flat portion PLA, a plurality of inclined portions SL, and a plurality of boundary portions BDL. The flat portion PLA may have a rectangular shape that has long sides extending in a first direction DR1, and short sides extending in a second direction DR2 crossing the first direction DR1. However, the present disclosure is not limited thereto, and the flat portion PLA may have a rectangular shape that has long sides extending in the second direction DR2, and short sides extending in the first direction DR1. The flat portion PLA may have a flat plate shape defined by the first and second directions DR1 and DR2.

Hereinafter, a third direction DR3 is defined as a direction that substantially perpendicular to the plane defined by the first and the second directions DR1 and DR2. Also, in this specification, the expression of "when viewed from the top" may mean a state when viewed in the third direction DR3. Hereinafter, the thickness is defined as the distance between the upper and lower surfaces of the corresponding component in the third direction DR3.

The inclined portions SL may be located on the long and short sides of the flat portion PLA. The inclined portions SL may extend from the long sides and short sides of the flat portion PLA, and may be integrally formed with the flat portion PLA. The inclined portions SL may include first inclined portions SL1 and second inclined portions SL2. The first inclined portions SL1 may extend in the second direction DR2. The second inclined portions SL2 may extend in the first direction DR1. The first inclined portions SL1 may be defined as inclined portions extending in (e.g., having a width in) the first direction DR1 from the short sides of the flat portion PLA. The second inclined portions SL2 may be defined as inclined portions extending in (e.g., having a width in) the second direction DR2 from the long sides of the flat portion PLA. The first and second inclined portions SL1 and SL2 may surround the flat portion PLA.

As an example, when viewed from the top, the lengths of the first inclined portions SL1 in the second direction DR2 may be shorter than the lengths of the second inclined portions SL2 in the first direction DR1. However, the present disclosure is not limited thereto, and the lengths of the second inclined portions SL2 may be shorter than the lengths of the first inclined portions SL1.

As illustrated in FIG. 2, the first inclined portion SL1 may extend from one side of the flat portion PLA in the first direction DR1. The first inclined portion SL1 may have a thickness that becomes less when going away from the flat portion PLA. The first inclined portion SL1 may be inclined downwards as going away from the flat portion PLA. An upper surface of the first inclined portion SL1 may have a height that becomes less as going away from an upper surface of the flat portion PLA.

A lower surface of the first inclined portion SL1 may be defined as being coplanar with a lower surface of the flat portion PLA. Although one of the first inclined portions SL1 is illustrated, any other first inclined portion SL1 may be substantially the same. In addition, the second inclined portions SL2 may be substantially the same as the first inclined portions SL1 except for extending in the second direction DR2 from the long sides of the flat portion PLA.

Referring to FIGS. 1 and 3, the boundary portions BDL may be located on opposite sides of the first inclined portions SL1 with respect to the second direction DR2. The boundary portions BDL may be located on opposite sides of the second inclined portions SL2 with respect to the first direction DR1. The boundary portions BDL may be located between the inclined portions SL adjacent to each other. The boundary portions BDL may be located to correspond to corners of the flat portion PLA. The boundary portions BDL may extend from the corners of the flat portion PLA in a first diagonal direction DDR1 or a second diagonal direction DDR2. The first diagonal direction DDR1 may be defined as a direction crossing the first and second directions DR1 and DR2 on a plane defined by the first and second directions DR1 and DR2. The second diagonal direction DDR2 may be defined as a direction crossing the first diagonal direction DDR1.

When viewed from the top, the boundary portions BDL may widen in a direction away from the corners of the flat portion PLA. The boundary portions BDL may become thinner as going away from the flat portion PLA.

As illustrated in FIG. 3, boundary portions BDL may become lower as going away from the upper surface of the flat portion PLA. The boundary portions BDL may become thinner as going farther away from the flat portion PLA. A lower surface of the boundary portions BDL may be defined as being coplanar with the lower surface of the flat portion PLA.

Figure 4:
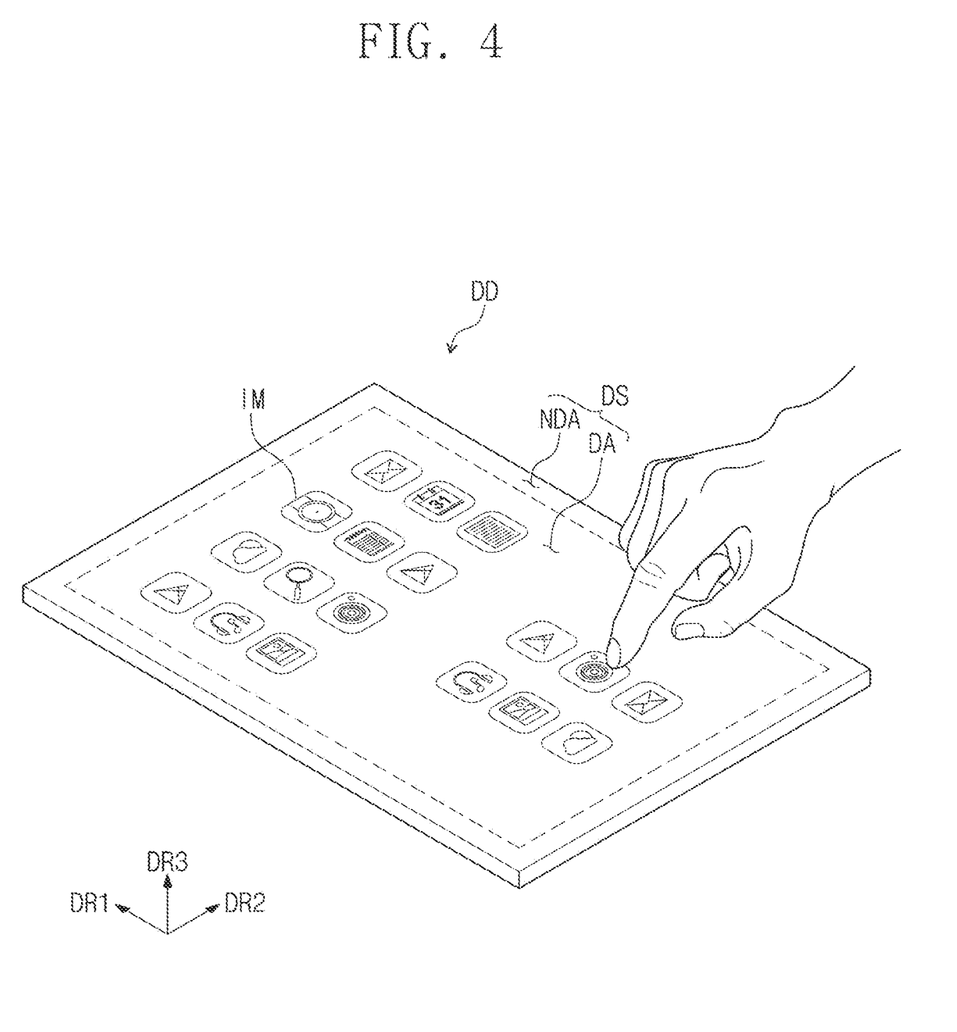
FIG. 4 is a perspective view of a display device.
Figure 5:
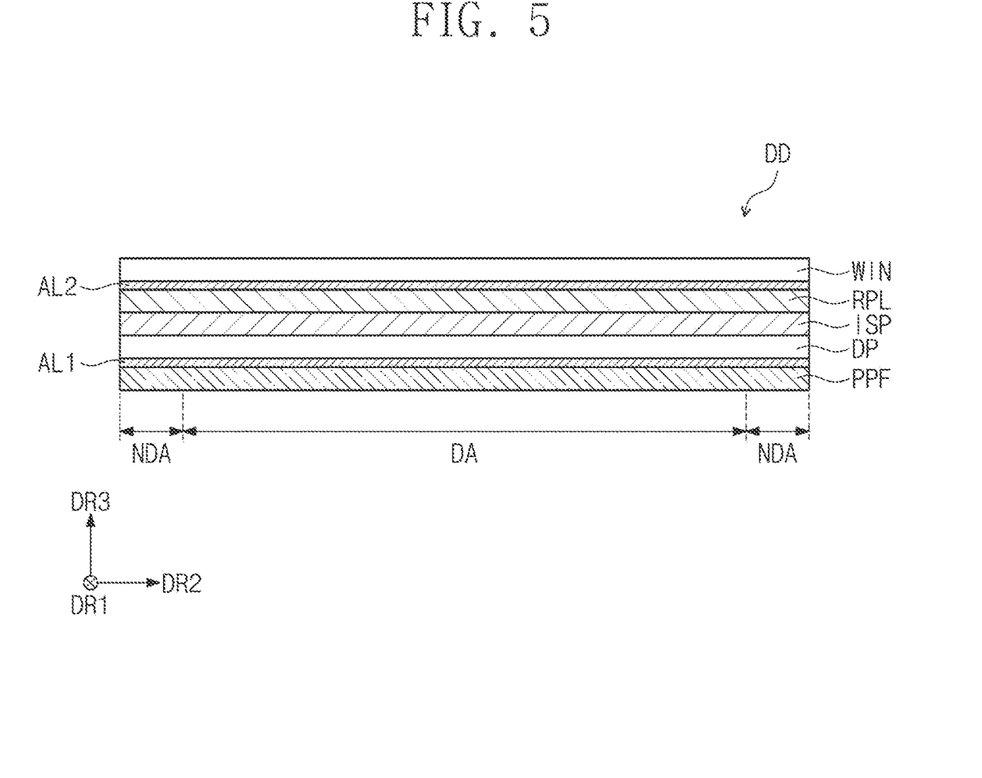
FIG. 5 is a view illustrating a cross-section of the display device illustrated in FIG. 4.
Figure 6:
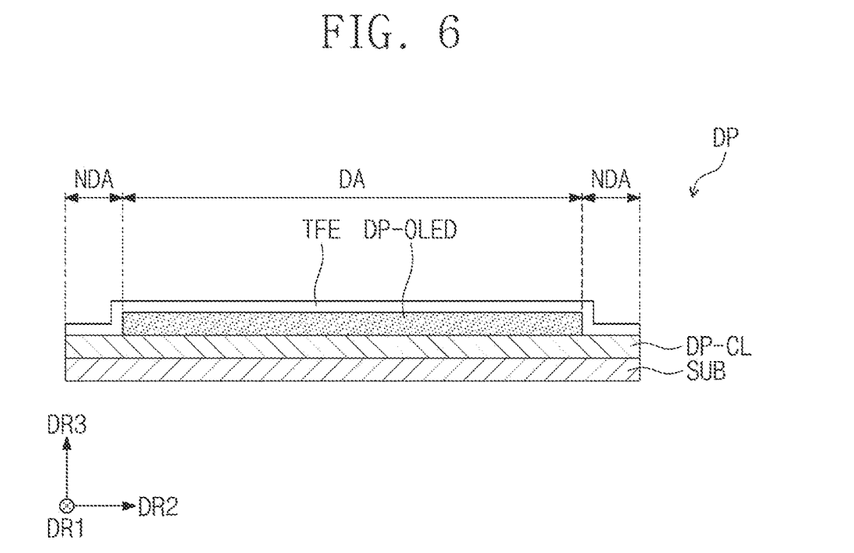
FIG. 6 is a view illustrating a cross-section of the display panel illustrated in FIG. 5.
Figure 7:
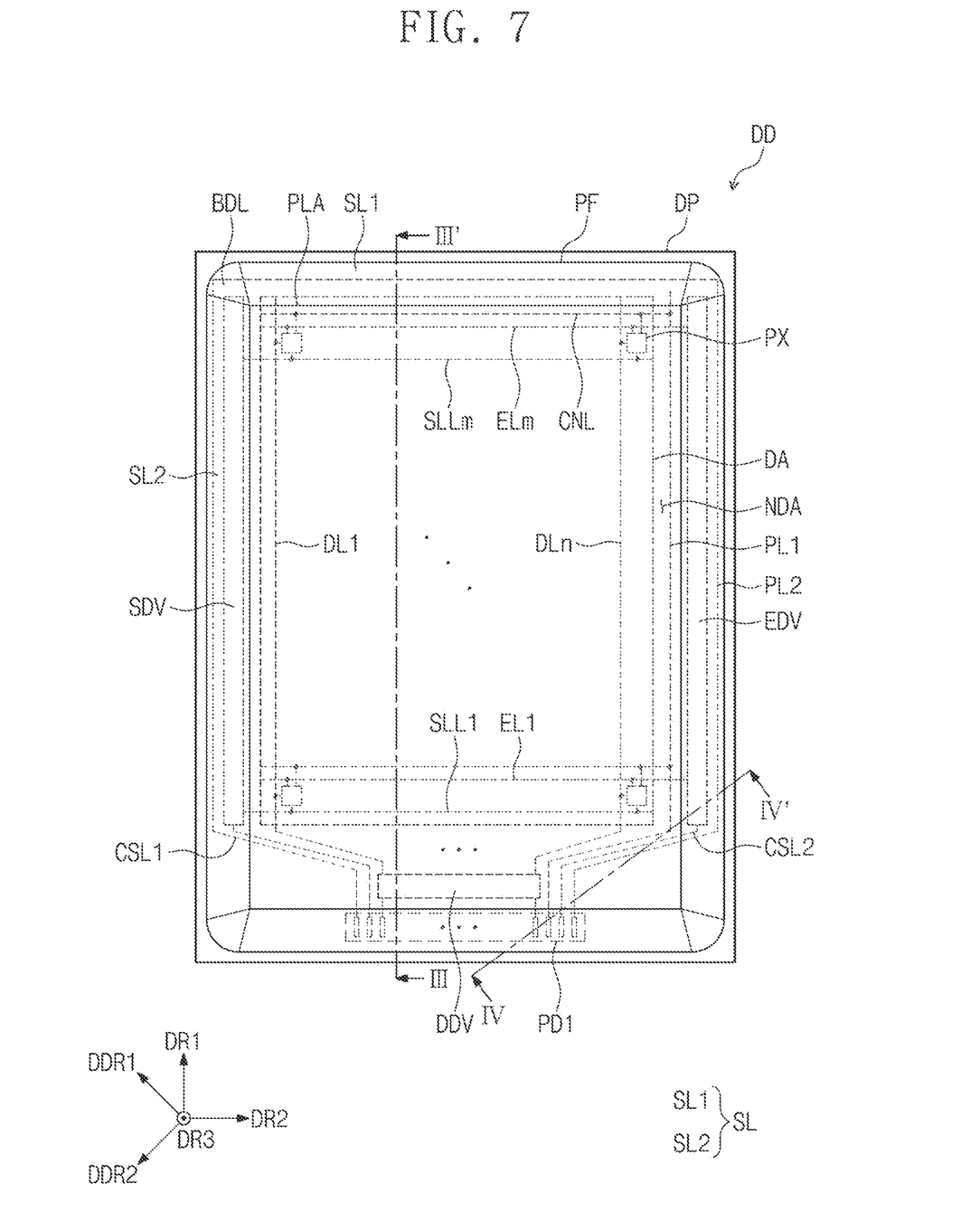
FIG. 7 is a plan view of a display panel to which the protective film illustrated in FIG. 1 is attached.

FIG. 4 is a perspective view of a display device. FIG. 5 is a view illustrating a cross-section of the display device illustrated in FIG. 4. FIG. 6 is a view illustrating a cross-section of the display panel illustrated in FIG. 5. FIG. 7 is a plan view of a display panel to which the protective film illustrated in FIG. 1 is attached. FIG. 4 illustrates a display device including the display panel of FIG. 7.

It is illustrated that the configuration of the display panel DP illustrated in FIG. 7 is indicated by a dotted line, and the protective film PF is indicated by a solid line.

Because a flat portion PLA, first inclined portions SL1, second inclined portions SL2, and boundary portions BDL in FIG. 7 are the same as the flat portion PLA, the first inclined portions SL1, the second inclined portions SL2, and the boundary portions BDL in FIG. 1, respectively, repeated descriptions thereof will be omitted or given briefly.

Referring to FIG. 4, the display device DD may have a rectangular shape that has long sides extending in the first direction DR1, and short sides extending in the second direction DR2.

An upper surface of the display device DD may be defined as a display surface DS, and may have a flat surface defined by the first direction DR1 and the second direction DR2. Through the display surface DS, an image IM generated in the display device DD may be provided to a user.

The display surface DS may include a display region DA, and a non-display region NDA around the display region DA. The display region DA may display an image, and the non-display region NDA may not display an image. The non-display region NDA may surround the display region DA, and may define an edge of the display device DD, which is printed with a color (e.g., a predetermined color).

The display device DD may be used in a large-sized electronic apparatus, such as a television, a monitor, or an external billboard. Also, the display device DD may be used in a small- or medium-sized electronic apparatus, such as personal computers, laptop computers, personal digital terminals, car navigation units, game consoles, smart phones, tablet computers, or cameras. However, these are merely provided as examples, and the display device DD may be used in other electronic apparatuses as long as not departing from the present disclosure.

Referring to FIG. 5, the display device DD may include a display panel DP, an input-sensing portion ISP, an anti-reflection layer RPL, a window WIN, a panel protective film PPF, and first and second adhesive layers AL1 and AL2.

The display panel DP may be a flexible panel. The display panel DP according to one or more embodiments of the present disclosure may be a light-emitting-type display panel, but is not particularly limited thereto. For example, the display panel DP may be an organic light-emitting display panel or an inorganic light-emitting display panel. A light-emitting layer of the organic light-emitting display panel may include an organic light-emitting material. A light-emitting layer of an inorganic light-emitting display panel may include quantum dots, quantum rods, or the like. Hereinafter, the display panel DP is described as the organic light-emitting display panel.

The input-sensing portion ISP may be located on the display panel DP. In one or more embodiments, the input-sensing portion ISP may include a plurality of sensing portions for sensing an external input in a capacitive manner. The input-sensing portion ISP may be provided directly on the display panel DP when the display device DD is manufactured. However, the present disclosure is not limited thereto. The input-sensing portion ISP may be provided as a separate panel from the display panel DP, and may be attached to the display panel DP by the adhesive layer.

The anti-reflection layer RPL may be located on the input-sensing portion ISP. The anti-reflection layer RPL may be provided directly on the input-sensing portion ISP when the display device DD is manufactured. However, the present disclosure is not limited thereto, and the anti-reflection layer RPL may be provided as a separate panel from the display panel DP, and may be attached to the input-sensing portion ISP by the adhesive layer.

The anti-reflection layer RPL may be defined as an external light anti-reflection film. The anti-reflection layer RPL may reduce the reflectance for external light that enters the display panel DP from above the display device DD. External light may be invisible to the user due to the anti-reflection layer RPL.

When external light traveling toward the display panel DP is reflected from the display panel DP and provided back to an external user, the user may view the external light like a mirror. To reduce or prevent the effects of this phenomenon, the anti-reflection layer RPL may include, for example, a plurality of color filters that display the same color as the pixels of the display panel DP.

The color filters may filter external light into the same color as the pixels. In this case, external light may be invisible to the user. However, the present disclosure is not limited thereto, and the anti-reflection layer RPL may include a retarder and/or a polarizer for reducing the reflectance for the external light.

The window WIN may be located on the anti-reflection layer RPL. The window WIN may protect the display panel DP, the input-sensing portion ISP, and the anti-reflection layer RPL against scratch and impact from the outside.

The panel protective film PPF may be located below the display panel DP. The panel protective film PPF may protect a lower portion of the display panel DP. The panel protective film PPF may include a flexible plastic material, such as polyethyleneterephthalate (PET).

The first adhesive layer AL1 may be located between the display panel DP and the panel protective film PPF, and the display panel DP and the panel protective film PPF may be bonded to each other by the first adhesive layer AL1. The second adhesive layer AL2 may be located between the window WIN and the anti-reflection layer RPL, and the window WIN and the anti-reflection layer RPL may be bonded to each other by the second adhesive layer AL2.

Referring to FIG. 6, the display panel DP may include a substrate SUB, a circuit element layer DP-CL located on the substrate SUB, a display element layer DP-LE located on the circuit element layer DP-CL, and a thin-film encapsulation layer TFE located on the display element layer DP-LE.

The substrate SUB may include a display region DA, and a non-display region NDA around the display region DA. The substrate SUB may include a flexible plastic material, such as glass or polyimide (PI). The display element layer DP-LE may be located on the display region DA.

A plurality of pixels may be located on the circuit element layer DP-CL and the display element layer DP-LE. Each of the pixels may include transistors located on the circuit element layer DP-CL, and light-emitting elements located on the display element layer DP-LE and connected to the transistors.

The thin-film encapsulation layer TFE may be located on the circuit element layer DP-CL to cover the display element layer DP-LE. The thin-film encapsulation layer TFE may protect pixels from moisture, oxygen, and external foreign substances.

Referring to FIG. 7, the display device DD may include a display panel DP, a scan driver SDV, a data driver DDV, a light emission driver EDV, and a plurality of pads PD.

The display panel DP may have a rectangular shape that has long sides extending in the first direction DR1, and short sides extending in the second direction DR2, but the shape of the display panel DP is not limited thereto. The display panel DP may include a display region DA, and a non-display region NDA surrounding the display region DA.

The display panel DP may include a plurality of pixels PX, a plurality of scan lines SLL1 to SLLm, a plurality of data lines DL1 to DLn, a plurality of light emission lines EL1 to Elm, first and second control lines CSL1 and CSL2, first and second power lines PL1 and PL2, and connection lines CNL. Here, m and n are natural numbers.

The pixels PX may located in the display region DA. A scan driver SDV and a light emission driver EDV may be located in the non-display region NDA adjacent to respective ones of the long sides of the display panel DP. The data driver DDV may be located in the non-display region NDA adjacent to one of the short sides of the display panel DP. When viewed from the top, the data driver DDV may be adjacent to a lower end of the display panel DP.

The scan lines SLL1 to SLm may extend in the second direction DR2, and may be connected to the pixels PX and the scan driver SDV. The data lines DL1 to DLn may extend in the first direction DR1, and may be connected to the pixels PX and the data driver DDV. The light emission lines EL1 to ELm may extend in the second direction DR2, and may be connected to the pixels PX and the light emission driver EDV.

The first power line PL1 may extend in the first direction DR1, and may be located on the non-display region NDA. The first power line PL1 may be located between the display region DA and the light emission driver EDV, but the present disclosure is not limited thereto. The first power line PL1 may be located between the display region DA and the scan driver SDV.

The connection lines CNL may extend in the second direction DR2, may be arranged in the first direction DR1, and may be connected to the first power line PL1 and the pixels PX. A first voltage may be applied to the pixels PX through the first power line PL1 and the connection lines CNL that are connected to each other.

The second power line PL2 may be located in the non-display region NDA, and may extend along the long sides of the display panel DP and another short side of the display panel DP in which the data driver DDV is not located. The second power line PL2 may be outside of the scan driver SDV and the light emission driver EDV.

In one or more embodiments, the second power line PL2 may extend toward the display region DA, and may be connected to the pixels PX. A second voltage having a lower level than the first voltage may be applied to the pixels PX via the second power line PL2.

The first control line CSL1 may be connected to the scan driver SDV, and may extend toward a lower end of the display panel DP. The second control line CSL2 may be connected to the light emission driver EDV, and may extend toward a lower end of the display panel DP. The data driver DDV may be located between the first control line CSL1 and the second control line CSL2.

The pads PD may be located in the non-display region NDA adjacent to the lower end of the display panel DP, and may be adjacent to the lower end of the display panel DP (e.g., more so than the data driver DDV). The data driver DDV, the first and second power line PL1 and PL2, and the first and second control lines CSL1 and CSL2 may be connected to the pads PD. The data lines DL1 to DLn may be connected to the data driver DDV, and the data driver DDV may be connected to the pads PD that correspond to the data lines DL1 to DLn.

In one or more embodiments, the display device DD may further include a timing controller for controlling operations of the scan driver SDV, the data driver DDV, and the light emission driver EDV, and a voltage generator for generating the first and second voltages. The timing controller and the voltage generator may be mounted on a printed circuit board, and may be connected to the pads PD through the printed circuit board.

The scan driver SDV may generate a plurality of scan signals, and the scan signals may be applied to the pixels PX through the scan lines SLL1 to SLLm. The data driver DDV may generate a plurality of data voltages, and the data voltages may be applied to the pixels PX through the data lines DL1 to DLn. The light emission driver EDV may generate a plurality of light emission signals, and the light emission signals may be applied to the pixels PX through the light emission lines EL1 to ELm.

The pixels PX may receive the data voltages in response to the scan signals. The pixels PX may display an image by emitting light, which has luminance corresponding to the data voltages, in response to the light emission signals.

The protective film PF may be located on the display panel DP. The protective film PF may cover an upper surface of the display panel DP. When viewed from the top (e.g., in plan view), the size of the display panel DP may be greater than that of the protective film PF.

The flat portion PLA may overlap the light emission lines EL1 to ELm, the scan lines SLL1 to SLLm, the connection lines CNL, and the data lines DL1 to DLn. The flat portion PLA may overlap the display region DA.

One first inclined portion SL1 among the first inclined portions SL1 opposed to each other with respect to the first direction DR1 may overlap the data driver DDV. Among the second inclined portions SL2 that are opposed to each other in the second direction DR2, the second inclined portion SL2 located on the left side may overlap the scan driver SDV. The second inclined portion SL2 located on the right side may overlap the light emission driver EDV.

In one or more embodiments, the protective film PF may be further attached to a lower surface of the display panel DP, and the protective film PF may cover the lower surface of the display panel DP. Hereinafter, the protective film PF attached to the upper surface of the display panel DP is defined as a first protective film PF1, and the protective film attached to the lower surface of the display panel is defined as a second protective film PF2. The first protective film PF1 and the second protective film PF2 will be described in detail with reference to FIGS. 10 and 11.

Figure 8:
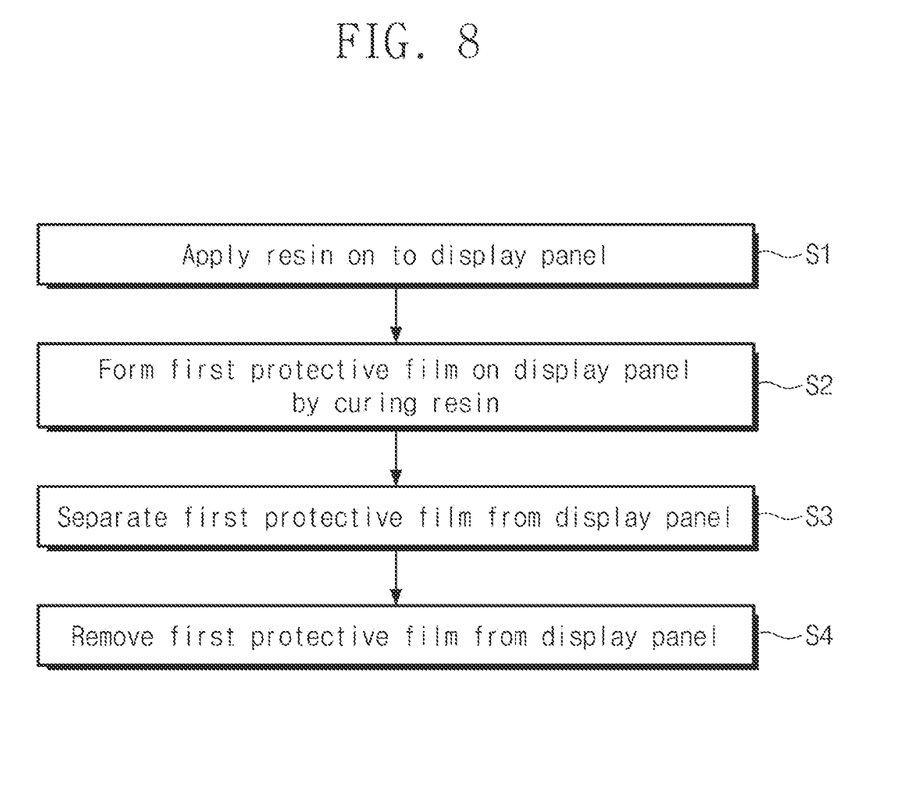
FIG. 8 is a flowchart illustrating a method of attaching and removing a protective film to and from the display panel of FIG. 7.

FIG. 8 is a flowchart illustrating a method of attaching and removing a protective film to and from the display panel of FIG. 7. FIGS. 9A to 9F are views for describing a method of attaching and removing a protective film to and from the display panel.

Figure 9A:
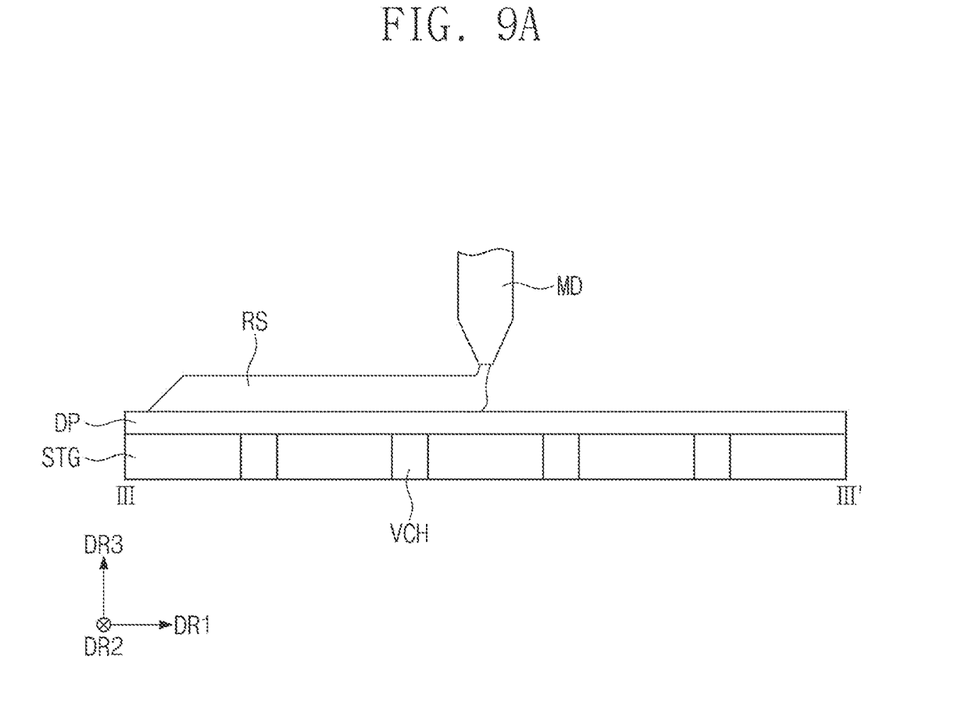
FIGS. 9A to 9F are views for explaining a method of attaching and removing a protective film to and from the display panel.
Figure 9B:
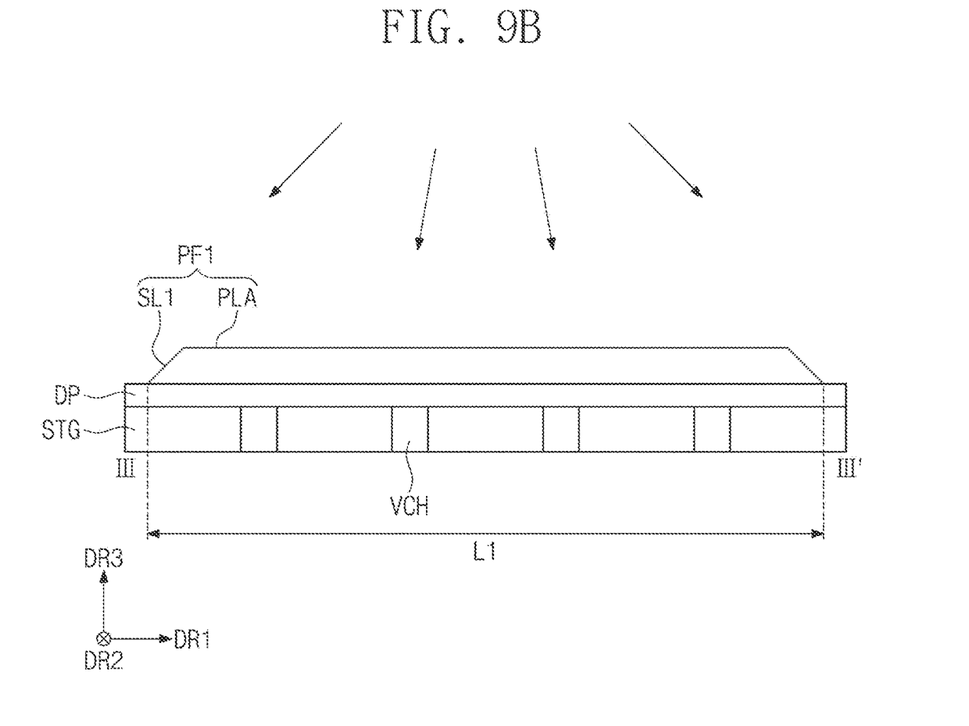
Figure 9C:
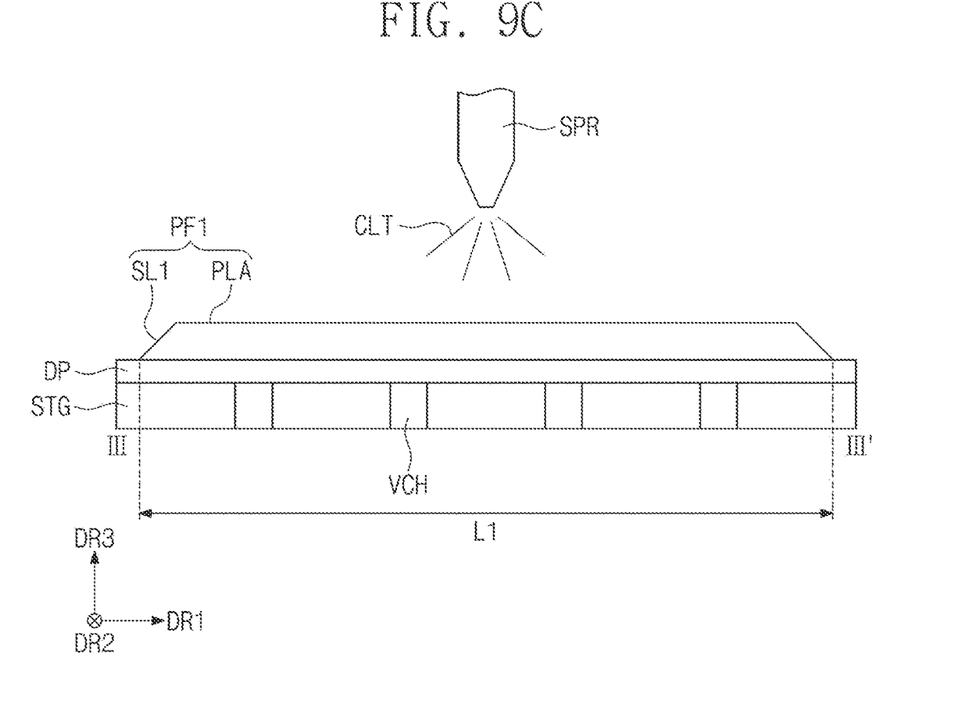
Figure 9D:
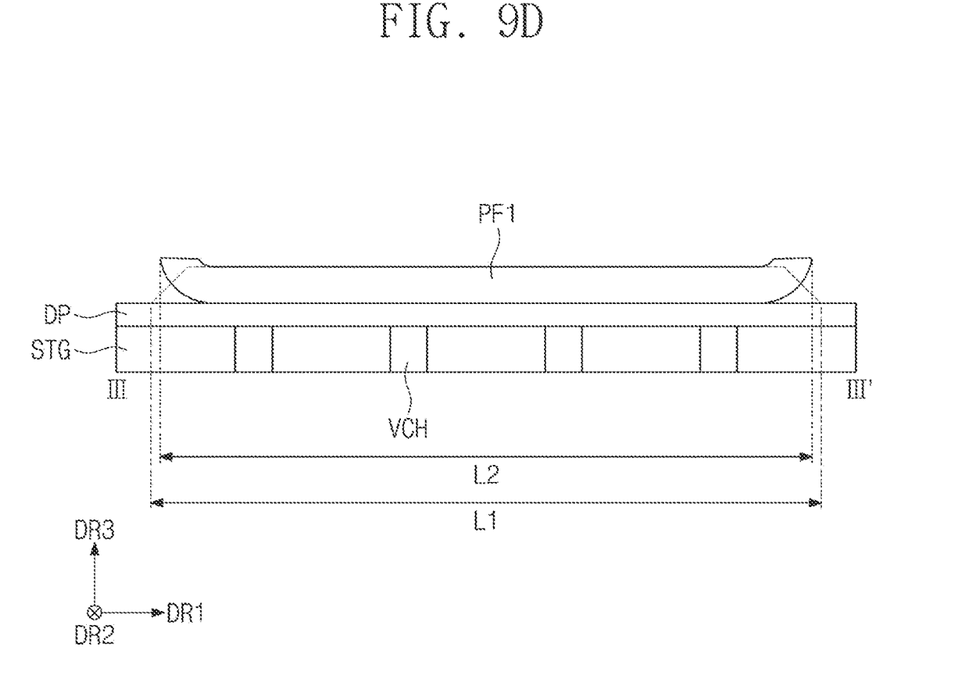
Figure 9E:
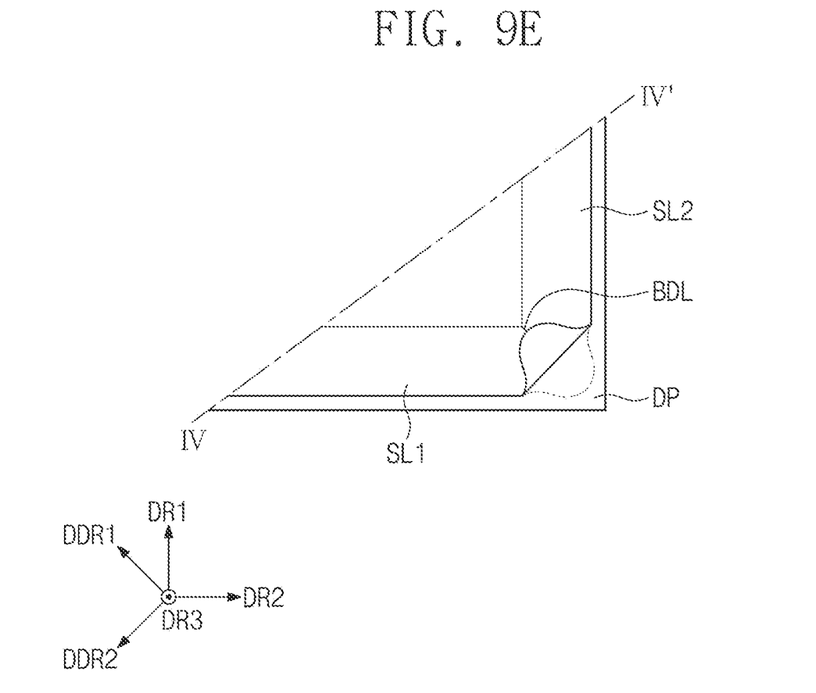

It is illustrated that FIGS. 9A to 9D and 9F are cross-sectional views taken along the line III-III' of FIG. 7, and FIG. 9E is an enlarged view adjacent the line IV-IV' of FIG. 7.

Because the display panels DP of FIGS. 8 and 9A to 9F are the same as the display panels DP of FIGS. 6 and 7, repeated descriptions thereof will be omitted or given briefly.

For convenience of description, the display panel DP of FIG. 7 is schematically illustrated as one layer in FIGS. 9A to 9F.

Because the protective film PF and the display panel DP of FIGS. 8 and 9A to 9F are the same as the protective film PF and the display panel DP of FIGS. 1 to 7, repeated descriptions will be omitted or given briefly.

Referring to FIGS. 8 and 9A, applying the resin RS onto the display panel DP (S1) may include providing the display panel DP on the stage STG. A plurality of vacuum suction holes VCH may be defined in the stage STG. When the states of the vacuum suction holes VCH are changed to vacuum states, the display panel DP may be fixed to the stage STG.

The resin RS may be applied on the display panel DP using the mold MD. For example, the resin RS may be provided onto the display panel DP through an inkjet method. The resin RS may include any one of acrylate, epoxy, or silicone.

Referring to FIGS. 8 and 9B, forming a first protective film PF1 on the display panel DP by curing the resin RS (S2) may be performed through either thermal curing or ultraviolet curing. The resin RS may be cured through thermal curing or UV curing.

The cured resin RS on the display panel DP may be defined as the first protective film PF1. A first length L1 of the first protective film PF1 in the first direction DR1 may be less than a length of the display panel DP in the first direction DR1. The first length L1 may be defined as the length of the first protective film PF1 in the first direction DR1 after curing.

Referring to FIGS. 8 and 9C, separating the first protective film PF1 from the display panel DP (S3) may include providing a coolant onto the surface of the first protective film PF1. An injector SPR may be located above the display panel DP and the first protective film PF1. The injector SPR may provide a coolant CLT onto the surface of the first protective film PF1. The coolant may be any one of a liquid nitrogen, a freon gas (CFC), or a fluorinated carbon (HFC)/carbon fluoride.

Referring to FIGS. 8, 9D, and 9E, when the coolant is provided onto the surface of the first protective film PF1, an upper surface of the first protective film PF1 may be contracted. For example, the first protective film PF1 may have a thermal expansion coefficient of about 45 ppm/K to about 55 ppm/K. The thermal expansion coefficient of the first protective film PF1 may be greater than that of the display panel DP. The second length L2 of the contracted first protective film PF1 may be less than the first length L1. The second length L2 may be defined as the length of the contracted first protective film PF1 in the first direction DR1. The first protective film PF1 may be contracted more than the display panel DP.

When a difference in degree of contraction between the first protective film PF1 and the display panel DP occurs, the first protective film PF1 may be separated from the display panel DP. For example, as illustrated in FIGS. 9D and 9E, the first protective film PF1 may move from the edges of the boundary portions BDL in the third direction DR3 and in the first diagonal direction DDR1. In one or more embodiments, upper surfaces of the first and second inclined portions SL1 and SL2 are contracted. Thus, edges of the first and second inclined portions SL1 and SL2 may move in the third direction DR3, and may be separated from the display panel DP.

Figure 9F:
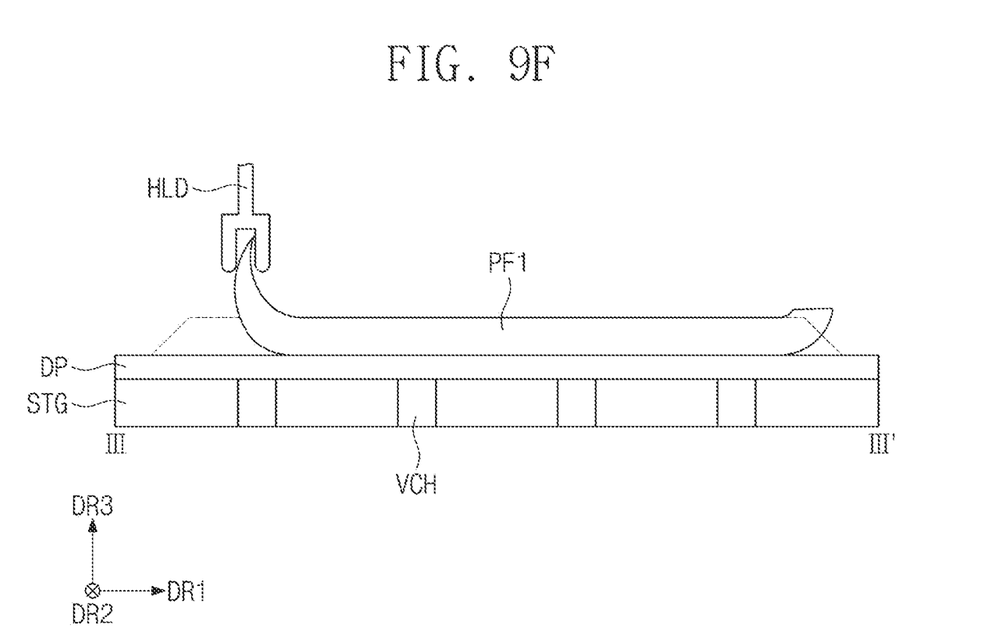

Referring to FIGS. 8 and 9F, removing the first protective film PF1 from the display panel DP (S4) may include disposing tongs HLD above the display panel DP. For example, the tongs HLD may be tweezers, but is not limited thereto, and may be a roller or a robot arm.

One side of both sides of the first protective film PF1 separated from the display panel DP may be fixed by the tongs HLD. For example, the tongs HLD may move one side of the first protective film PF1 in the third direction DR3 and the first direction DR1. Accordingly, the first protective film PF1 may be removed from the display panel DP.

When separating the first protective film PF1 from the display panel DP, a roller or tape may be attached to the first protective film PF1, and then the roller or tape may be moved to separate the first protective film PF1 from the display panel. The first protective film PF1 may be pressed and attached to a roller or tape. As the external force due to pressing is applied to the first protective film PF1, the external force may be transmitted to the display panel DP. Accordingly, the display panel DP may be damaged. In addition, when a foreign substance is present on the upper surface of the first protective film PF1, the foreign substance may be pressed onto the display panel DP by an external force during attachment of the first protective film PF1 to a roller or a tape, thereby resulting in a dent or the like. Accordingly, the display panel DP may be damaged.

In the method of removing the first protective film PF1 according to one or more embodiments of the present disclosure, an external force is not applied, and when a coolant is applied onto the upper surface of the first protective film PF1, the upper surface of the first protective film PF1 may be contracted. A difference in degree of contraction may occur due to a difference in thermal expansion coefficient between the display panel DP and the first protective film PF1, and the first protective film PF1 may be separated from the display panel DP. Accordingly, the separated first protective film PF1 is attached to the roller or the tape without external force, and the first protective film PF1 may be easily removed from the display panel DP. Accordingly, the first protective film PF1 may be removed from the display panel DP without damaging the display panel DP.

Figure 10:
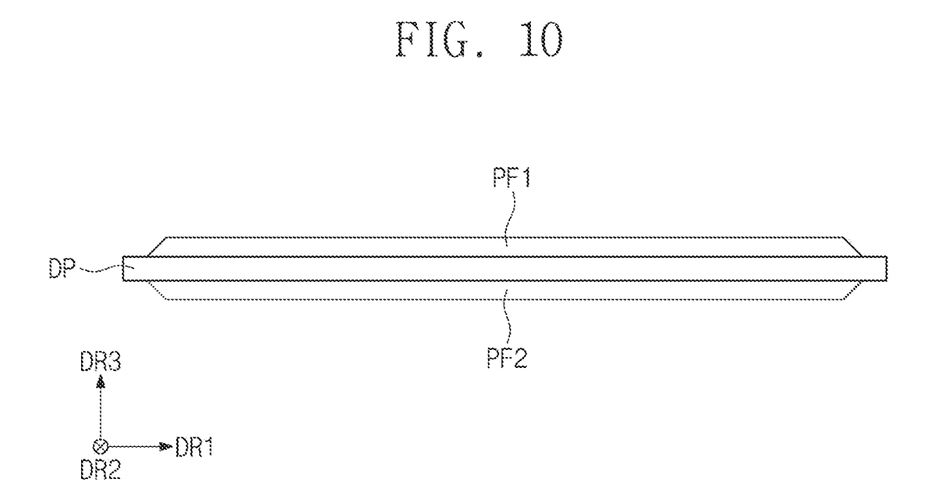
FIG. 10 illustrates protective films attached to a display panel according to one or more other embodiments of the present disclosure.
Figure 11:
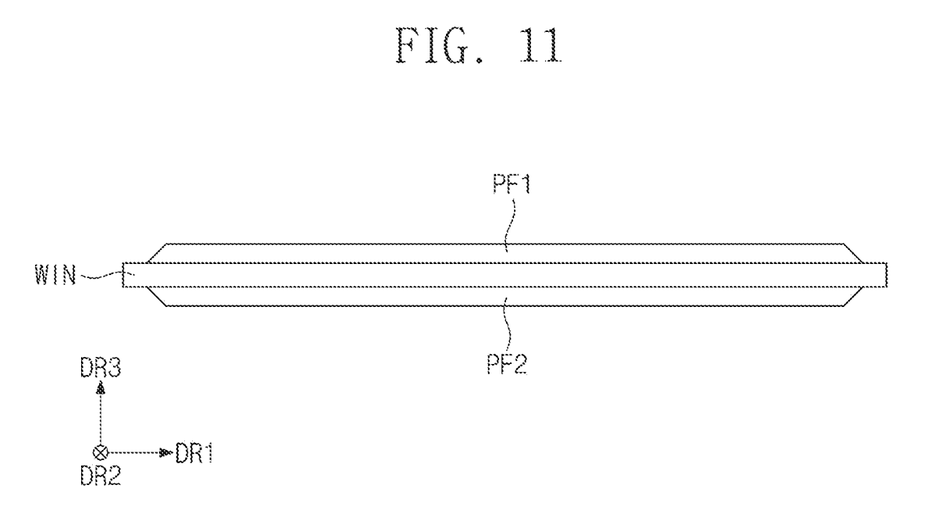
FIG. 11 illustrates protective films attached to a window according to one or more other embodiments of the present disclosure.

FIG. 10 illustrates protective films attached to a display panel according to one or more other embodiments of the present disclosure. FIG. 11 illustrates protective films attached to a window according to one or more other embodiments of the present disclosure.

FIGS. 10 and 11 illustrate the first and second protective films PF1 and PF2, the display panel DP, and/or the window WIN as viewed in the second direction DR2.

Referring to FIG. 10, the second protective film PF2 may be attached to the lower surface of the display panel DP. The second protective film PF2 may cover the lower surface of the display panel DP. The second protective film PF2 may have a shape symmetrical to the first protective film PF1 in the third direction DR3. A method of removing the second protective film PF2 may be the same as described with reference to FIGS. 9A to 9F, and thus repeated description thereof will be omitted.

Referring to FIG. 11, the first and second protective films PF1 and PF2 may be respectively attached to upper and lower surfaces of the window WIN. A method of attaching and removing the first and second protective films PF1 and PF2 to and from the window WIN is the same as described with reference to FIGS. 1 to 9F, and thus descriptions thereof will be omitted.

According to one or more embodiments of the present disclosure, when a coolant is applied onto a panel protective film located on a display panel, the panel protective film may be contracted. Due to the difference in thermal expansion coefficient between the display panel and the panel protective film, the contracted panel protective film may be separated from the display panel such that separation starts from an edge of the panel protective film. Accordingly, the panel protective film may be easily separated from the display panel without applying an external force to the display panel and the panel protective film. Thus, damage to the display panel may be reduced or prevented.

It will be apparent to those skilled in the art that various modifications and variations can be made in the present disclosure. Thus, it is intended that the present disclosure covers the modifications and variations of the disclosed embodiments, provided that they come within the scope of the appended claims and their equivalents. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A method of removing a protective film, the method comprising:
    applying a resin onto a display panel;
    forming a first protective film by curing the resin;
    providing a coolant to a surface of the first protective film;
    separating an edge of the first protective film from the display panel; and
    removing the first protective film from the display panel,
    wherein the first protective film comprises:
        a flat portion defined by a first direction and a second direction crossing the first direction;
        inclined portions extending from the flat portion and surrounding the flat portion in a plan view; and
        boundary portions respectively between the inclined portions adjacent to each other to correspond to corners of the flat portion,
        wherein the inclined portions and the boundary portions become thinner in a direction away from the flat portion, and
        wherein lower surfaces of the inclined portions and the boundary portions are coplanar with a lower surface of the flat portion.

2. The method of claim 1, wherein the separating of the edge of the first protective film from the display panel comprises contracting upper surfaces of the boundary portions.

3. The method of claim 2, wherein the removing of the first protective film from the display panel comprises separating the first protective film from edges of the boundary portions.

4. The method of claim 2, wherein the separating of the edge of the first protective film from the display panel comprises separating the edges of the inclined portions from the display panel by contracting upper surfaces of the inclined portions.

5. The method of claim 1, wherein the first protective film has a higher coefficient of thermal expansion than the display panel.

6. The method of claim 5, wherein the first protective film has a coefficient of thermal expansion of about 45 ppm/K to about 55 ppm/K.

7. The method of claim 1, wherein the first protective film is contracted more than the display panel when the coolant is provided onto the first protective film.

8. The method of claim 1, wherein heights of upper surfaces of the inclined portions and the boundary portions decrease in a direction away from an upper surface of the flat portion.

9. The method of claim 1, wherein the coolant comprises any one of a liquid nitrogen, a freon gas, or a carbon fluoride.

10. The method of claim 1, further comprising:
    providing the display panel on a stage; and
    fixing the display panel to the stage via vacuum suction holes defined in the stage.

11. The method of claim 1, wherein the resin comprises any one of an acrylate, an epoxy, or a silicone.

12. The method of claim 1, further comprising:
    applying the resin to a lower surface of the display panel;
    forming a second protective film by curing the resin;
    providing a coolant onto a surface of the second protective film;
    separating an edge of the second protective film from the display panel; and
    removing the second protective film from the display panel.

13. A method of removing a protective film, the method comprising:
    applying a resin onto a display panel;
    forming a first protective film by curing the resin;
    providing a coolant onto a surface of the first protective film;
    separating an edge of the first protective film from the display panel; and
    removing the first protective film from the display panel,
    wherein the first protective film comprises:
        a flat portion defined by a first direction and a second direction crossing the first direction;
        inclined portions extending from the flat portion and surrounding the flat portion; and
        boundary portions between the inclined portions adjacent to each other to correspond to corners of the flat portion,
        wherein the inclined portions and the boundary portions become thinner in a direction away from the flat portion,
        wherein lower surfaces of the inclined portions and the boundary portions are coplanar with a lower surface of the flat portion, and
        wherein the first protective film has a higher coefficient of thermal expansion than the display panel.

* * * * *